(12) United States Patent
Chen et al.

(10) Patent No.: US 10,796,752 B2
(45) Date of Patent: Oct. 6, 2020

(54) STATIC RANDOM ACCESS MEMORY CELL AND OPERATING METHOD THEREOF CAPABLE OF REDUCING LEAKAGE CURRENT

(71) Applicant: UNITED MICROELECTRONICS CORP., Hsin-Chu (TW)

(72) Inventors: Yung-Ting Chen, Hsinchu County (TW); Hsueh-Chun Hsiao, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/290,950

(22) Filed: Mar. 3, 2019

(65) Prior Publication Data
US 2020/0258570 A1  Aug. 13, 2020

(30) Foreign Application Priority Data

Feb. 12, 2019  (CN) .......................... 2019 1 0111353

(51) Int. Cl.
*G11C 11/00* (2006.01)
*G11C 11/419* (2006.01)
*G11C 11/412* (2006.01)

(52) U.S. Cl.
CPC .......... *G11C 11/419* (2013.01); *G11C 11/412* (2013.01)

(58) Field of Classification Search
CPC .... G11C 11/419; G11C 11/412; G11C 11/413
See application file for complete search history.

(56) References Cited

U.S. PATENT DOCUMENTS

| | | | |
|---|---|---|---|
| 7,177,177 B2 | 2/2007 | Chuang | |
| 7,385,840 B2 * | 6/2008 | Redwine | G11C 11/412 365/154 |
| 7,483,332 B2 * | 1/2009 | Houston | G11C 7/1051 365/154 |
| 7,768,816 B2 * | 8/2010 | Joshi | G11C 11/413 365/154 |
| 8,339,838 B2 | 12/2012 | Ramaraju | |
| 8,867,264 B2 * | 10/2014 | Abouzeid | G11C 11/413 365/156 |
| 9,490,008 B1 * | 11/2016 | Moharir | G11C 11/419 |
| 2010/0142258 A1 | 6/2010 | Tsai | |

OTHER PUBLICATIONS

Chang, "A 32 kb 10T Sub-Threshold SRAM Array With Bit-Interleaving and Differential Read Scheme in 90 nm CMOS", Feb. 2009.

* cited by examiner

*Primary Examiner* — Pho M Luu
(74) *Attorney, Agent, or Firm* — Winston Hsu (57) ABSTRACT

A static random access memory cell includes first and second cross-coupled inverters, a write transistor and a read transistor. The first inverter has a first latch node and the second inverter has a second latch node. The write transistor is coupled in series with a wordline transistor between the first latch node of the first inverter and a bitline. The read transistor is coupled between the bitline and a reference terminal and has a control terminal coupled to the first latch node of the first inverter. A method of operating the static random access memory cell includes enabling the wordline transistor during a write operation, and enabling the write transistor during the write operation. The reference terminal is set to floating during the write operation.

30 Claims, 7 Drawing Sheets

STATIC RANDOM ACCESS MEMORY CELL AND OPERATING METHOD THEREOF CAPABLE OF REDUCING LEAKAGE CURRENT

BACKGROUND OF THE INVENTION

1. Field of the Invention

The invention is related to a static random access memory cell and an operating method thereof, and more particularly to a static random access memory cell and an operating method thereof for effectively reducing half select disturb and leakage current.

2. Description of the Prior Art

Static random access memory (SRAM) is widely used for caches of processors for computers, workstations, electronic devices, hard disk buffers, router buffers . . . etc.

In recent years with rapid development of technology, the ratio of SRAM to the total area of the chip is getting higher, and many portable electronic devices are increasingly demanding longer battery life. Therefore, circuits are designed to reduce the overall power consumption with low operating voltage. Hence, reducing the operating voltage of the SRAM becomes extremely important. However, the circuit of conventional SRAM cannot operate at a low voltage because it causes problems such as half select disturb and leakage current. Therefore, a new type of SRAM design is needed to make improvement.

SUMMARY OF THE INVENTION

An embodiment discloses a static random access memory cell including first and second cross-coupled inverters, a write transistor and a read transistor. The first inverter has a first latch node and the second inverter has a second latch node. The write transistor is coupled in series with a wordline transistor between the first latch node of the first inverter and a bitline. The read transistor is coupled between the bitline and a reference terminal and has a control terminal coupled to the first latch node of the first inverter.

Another embodiment discloses a method of operating the static random access memory cell. The method includes enabling the wordline transistor during a write operation, and enabling the write transistor during the write operation. The reference terminal is set to floating during the write operation.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
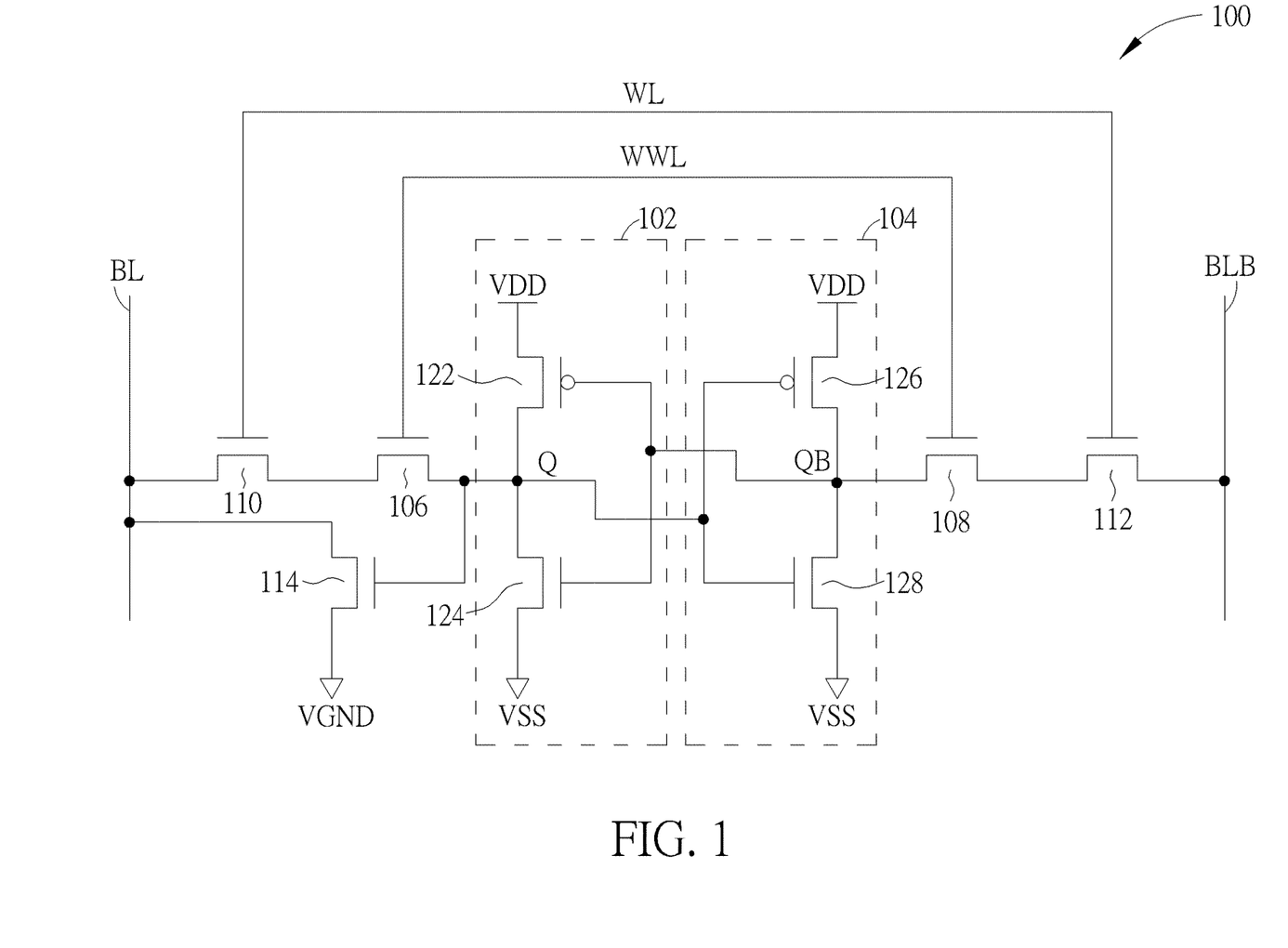
FIG. 1 is a diagram of an embodiment of a static random access memory cell.

FIG. 1 is a diagram of an embodiment of a static random access memory (SRAM) cell 100. The SRAM cell 100 comprises a first inverter 102, a second inverter 104, a first write transistor 106, a second write transistor 108, a first wordline transistor 110, a second wordline transistor 112 and a first read transistor 114.

The first inverter 102 comprises an output coupled to a first latch node Q and an input coupled to a second latch node QB. The second inverter 104 comprises an output coupled to a second latch node QB and an input coupled to the first latch node Q. The first wordline 110 comprises a first terminal coupled to a first bitline BL, a second terminal and a control terminal coupled to a wordline WL. The first write transistor 106 comprises a first terminal coupled to the second terminal of the first wordline transistor 110, a second terminal coupled to the first latch node Q, and a control terminal coupled to a write line WWL. The second write transistor 108 comprises a first terminal coupled to the second latch node QB, a second terminal, and a control terminal coupled to the write line WWL. The second wordline transistor 112 comprises a first terminal coupled to the second terminal of the second write transistor 108, a second terminal coupled to a second bitline BLB, and a control terminal coupled to the wordline WL. The first read transistor 114 comprises a first terminal coupled to the first bitline BL, a second terminal coupled to a reference terminal VGND, and a control terminal coupled to the first latch node Q. The first write transistor 106, the second write transistor 108, the first wordline transistor 110, the second wordline transistor 112 and the first read transistor 114 may all be n-type transistors.

The first inverter 102 comprises a pull-up transistor 122 and a pull-down transistor 124. The pull-up transistor 122 can be a p-type transistor and the pull-down transistor 124 can be an n-type transistor. The pull-up transistor 122 comprises a first terminal coupled to a first voltage source VDD, a second terminal coupled to the first latch node Q and a control terminal coupled to the second latch node QB. The pull-down transistor 124 comprises a first terminal coupled to the first latch node Q, a second terminal coupled to a second voltage source VSS and a control terminal coupled to the second latch node QB. The first voltage source VDD can provide a system voltage and the second voltage source VSS can provide a ground voltage.

The second inverter 104 comprises a pull-up transistor 126 and a pull-down transistor 128. The pull-up transistor 126 can be a p-type transistor and the pull-down transistor 128 can be an n-type transistor. The pull-up transistor 126 comprises a first terminal coupled to a first voltage source VDD, a second terminal coupled to the second latch node QB and a control terminal coupled to the first latch node Q. The pull-down transistor 128 comprises a first terminal coupled to the second latch node QB, a second terminal coupled to a second voltage source VSS and a control terminal coupled to the first latch node Q.

Figure 2:
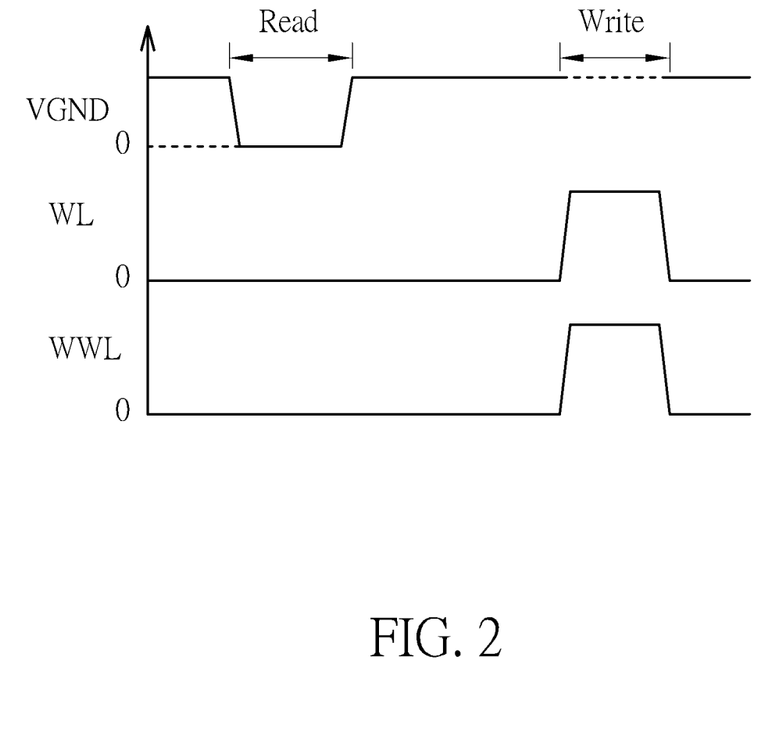
FIG. 2 is a diagram of voltage variations during the read and write operation of the static random access memory cell.

FIG. 2 is a diagram of voltage variations during the read and write operation of the SRAM cell 100. During the write operation, a wordline signal enables the first wordline transistor 110 and the second wordline transistor 112 through the wordline WL, and a write signal enables the first write transistor 106 and the second write transistor 108 through the write line WWL. In addition, the reference terminal VGND is set to floating. In this way, the first wordline transistor 110 and the first write transistor 106 establishes conduction between the first latch node Q and the first bitline BL. The second wordline transistor 112 and the second write transistor 108 establishes conduction between the second latch node QB and the second bitline BLB. It allows the value of the first bitline BL (0 or 1) to be transmitted the first latch node Q and stored in the SRAM cell 100.

During the read operation, a wordline signal disables the first wordline transistor 110 and the second wordline transistor 112 via the wordline WL, and a write signal disables the first write transistor 106 and the second write transistor 108 via the write line WWL. The first bitline BL can be precharged to a high voltage and the reference terminal VGND can be set to a low voltage. If the value stored in the first latch node Q is 1 and the value stored in the second latch node QB is 0, then the first read transistor 114 is enabled and the voltage of the first bitline BL would be pulled down to low by the reference terminal VGND. The value stored in the SRAM cell 100 can be obtained by comparing the voltage of the first bitline BL with a predetermined voltage set between the high voltage and the low voltage. If the value stored in the first latch node Q is 0 and the value stored in the second latch node QB is 1, then the first read transistor 114 is disabled and the first bitline BL maintains the high voltage. The value stored in the SRAM cell 100 can be obtained by comparing the voltage of the first bitline BL with the predetermined voltage set between the high voltage and the low voltage.

Figure 3:
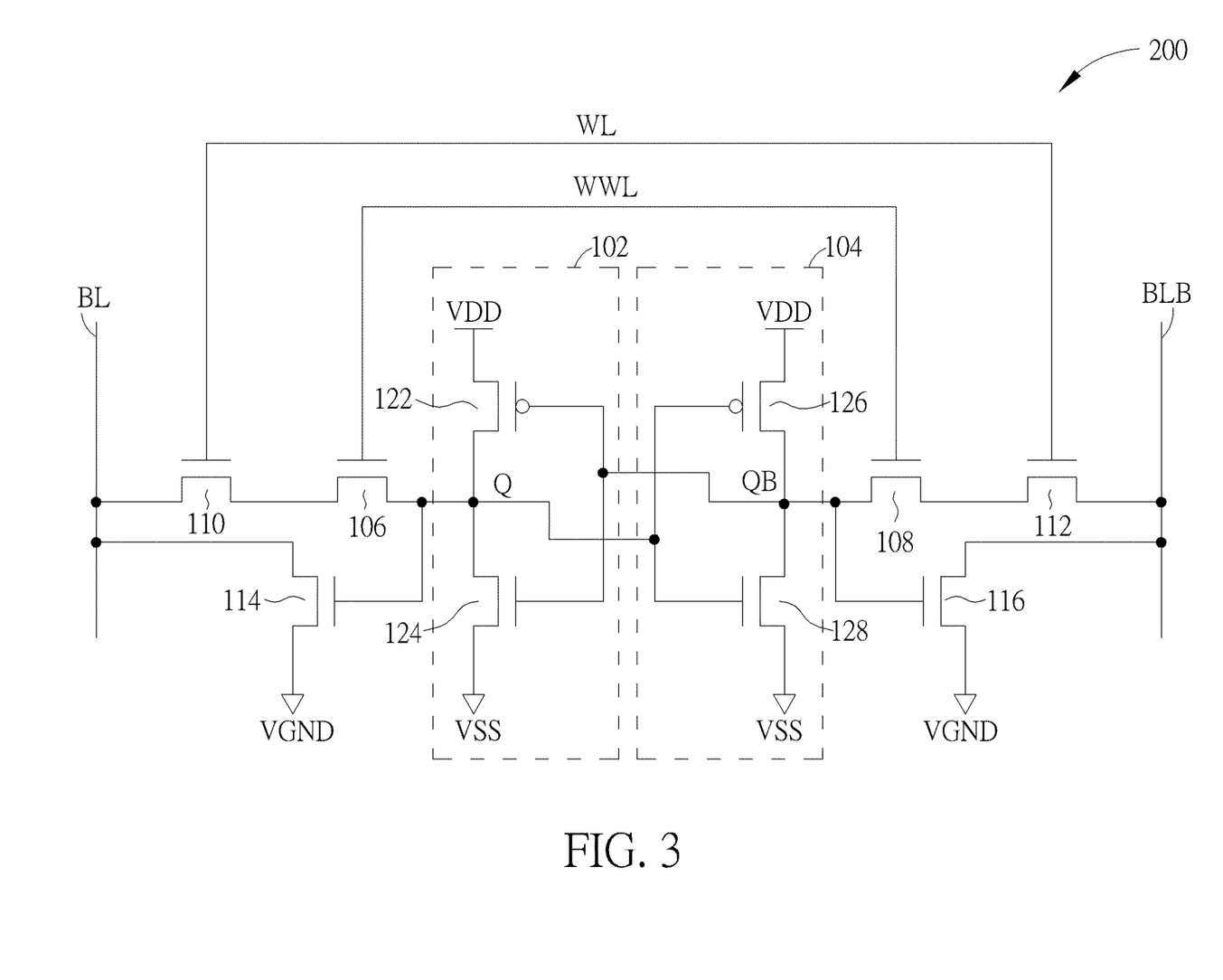
FIG. 3 is a diagram of another embodiment of a static random access memory cell.

FIG. 3 is a diagram of another embodiment of an SRAM cell 200. It differs from the SRAM cell 100 in that the SRAM cell 200 further comprises a second read transistor 116. The second read transistor 116 comprises a first terminal coupled to the second bitline BLB, a second terminal coupled to the reference terminal VGND and a control terminal coupled to the second latch node QB.

The write operation of the SRAM cell 200 is identical to the SRAM cell 100, yet the read operation is different. During the read operation, a wordline signal disables the first wordline transistor 110 and the second wordline transistor 112 via the wordline WL, and a write signal disables the first write transistor 106 and the second write transistor 108 via the write line WWL. The first bitline BL and the second bitline BLB can be precharged to a high voltage and the reference terminal VGND can be set to a low voltage. If the value stored in the first latch node Q is 1 and the value stored in the second latch node QB is 0, then the first read transistor 114 is enabled and the voltage of the first bitline BL would be pulled down to low by the reference terminal VGND. Because the second read transistor 116 is disabled, the second bitline BLB maintains the high voltage. If the value stored in the first latch node Q is 0 and the value stored in the second latch node QB is 1, then the second read transistor 116 is enabled and the voltage of the second bitline BLB would be pulled down to low by the reference terminal VGND. Because the first read transistor 114 is disabled, the first bitline BL maintains the high voltage. Therefore, the value stored in the SRAM cell 200 can be obtained.

Figure 4:
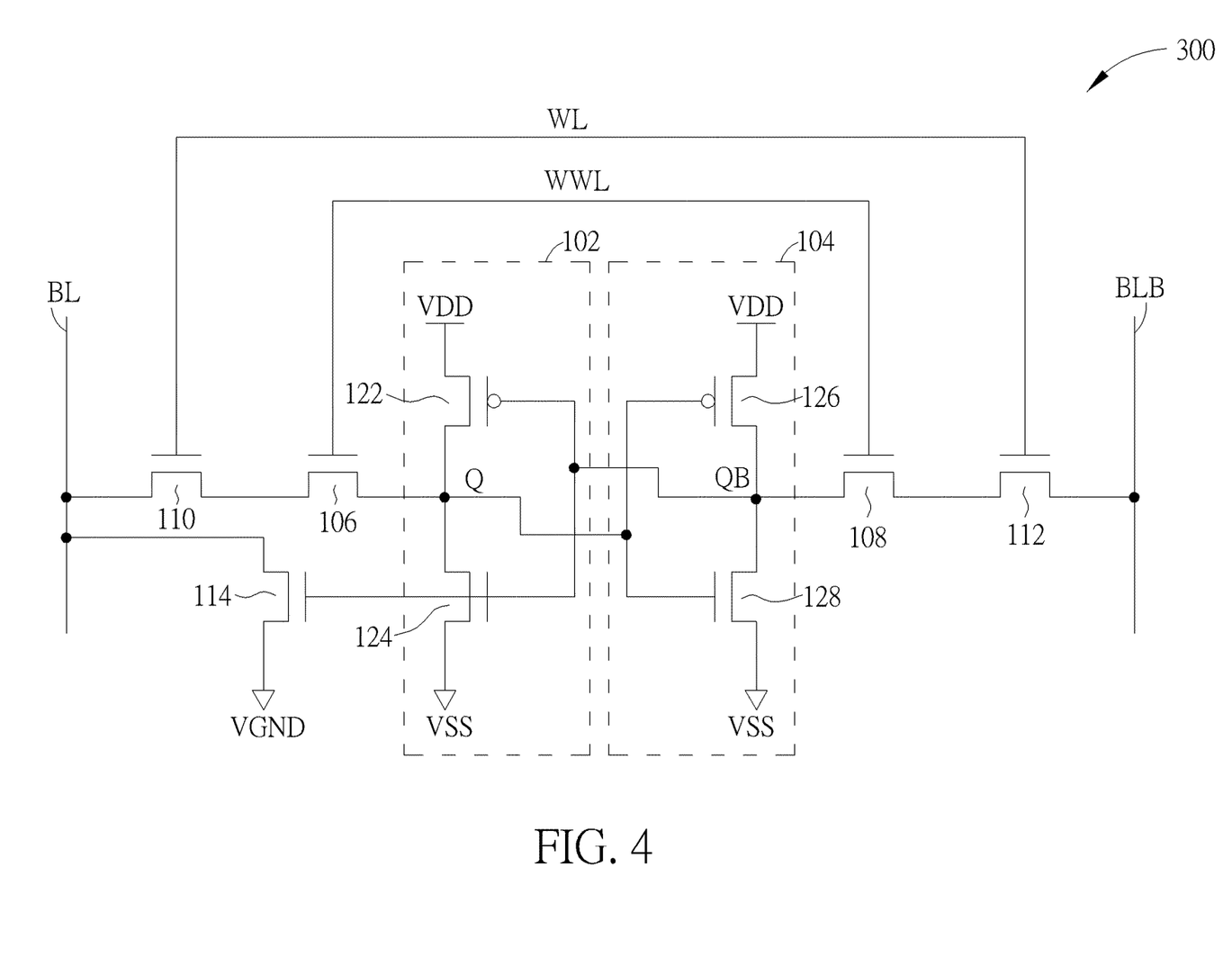
FIG. 4 is a diagram of another embodiment of a static random access memory cell.

FIG. 4 is a diagram of another embodiment of an SRAM cell 300. It differs from the SRAM cell 100 in that the control terminal of the first read transistor 114 is coupled to the second latch node QB.

The write operation of the SRAM cell 300 is identical to the SRAM cell 100, yet the read operation is different. During the read operation, a wordline signal disables the first wordline transistor 110 and the second wordline transistor 112 via the wordline WL, and a write signal disables the first write transistor 106 and the second write transistor 108 via the write line WWL. The first bitline BL can be precharged to a high voltage and the reference terminal VGND can be set to a low voltage. If the value stored in the first latch node Q is 0 and the value stored in the second latch node QB is 1, then the first read transistor 114 is enabled and the voltage of the first bitline BL would be pulled down to low by the reference terminal VGND. The value stored in the SRAM cell 300 can be obtained by comparing the voltage of the first bitline BL with a predetermined voltage set between the high voltage and the low voltage. If the value stored in the first latch node Q is 1 and the value stored in the second latch node QB is 0, then the first read transistor 114 is disabled and the first bitline BL maintains the high voltage. The value stored in the SRAM cell 300 can be obtained by comparing the voltage of the first bitline BL with the predetermined voltage set between the high voltage and the low voltage.

Figure 5:
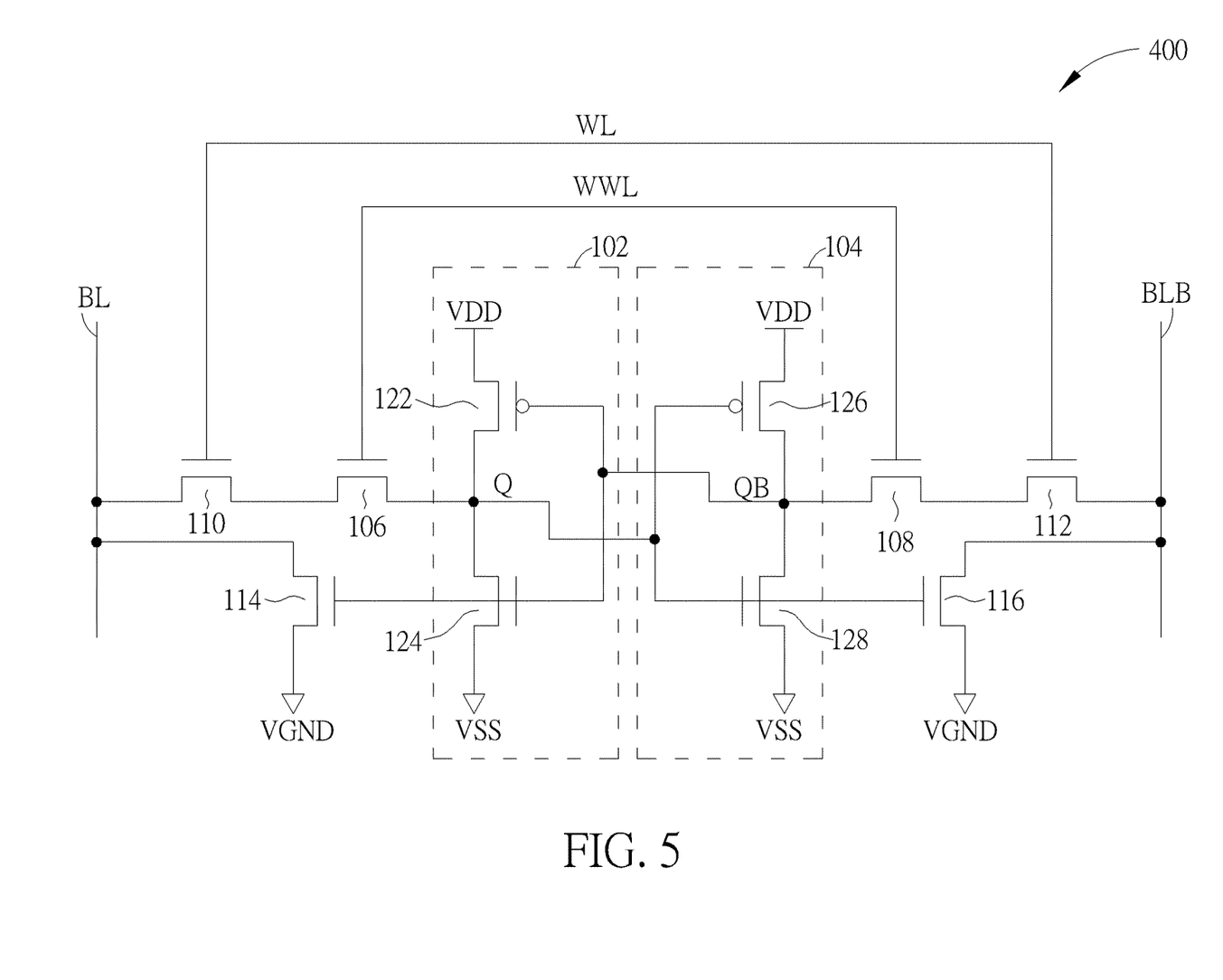
FIG. 5 is a diagram of another embodiment of a static random access memory cell.

FIG. 5 is a diagram of another embodiment of an SRAM cell 400. It differs from the SRAM cell 300 in that the SRAM cell 400 further comprises a second read transistor 116. The second read transistor 116 comprises a first terminal coupled to the second bitline BLB, a second terminal coupled to the reference terminal VGND and a control terminal coupled to the first latch node Q.

The write operation of the SRAM cell 400 is identical to the SRAM cell 300, yet the read operation is different. During the read operation, a wordline signal disables the first wordline transistor 110 and the second wordline transistor 112 via the wordline WL, and a write signal disables the first write transistor 106 and the second write transistor 108 via the write line WWL. The first bitline BL and the second bitline BLB can be precharged to a high voltage and the reference terminal VGND can be set to a low voltage. If the value stored in the first latch node Q is 0 and the value stored in the second latch node QB is 1, then the first read transistor 114 is enabled and the voltage of the first bitline BL would be pulled down to low by the reference terminal VGND. Because the second read transistor 116 is disabled, the second bitline BLB maintains the high voltage. If the value stored in the first latch node Q is 1 and the value stored in the second latch node QB is 0, then the second read transistor 116 is enabled and the voltage of the second bitline BLB would be pulled down to low by the reference terminal VGND. Because the first read transistor 114 is disabled, the first bitline BL maintains the high voltage. Therefore, the value stored in the SRAM cell 400 can be obtained.

The connection between the first bitline BL, the second bitline BLB and the first inverter 102, the second inverter 104 can be deactivated during the read operation of the SRAM cells 100, 200, 300 and 400. Therefore, it can diminish the effect of half select write disturb and leakage current on the SRAM cells 100, 200, 300 and 400.

Figure 6:
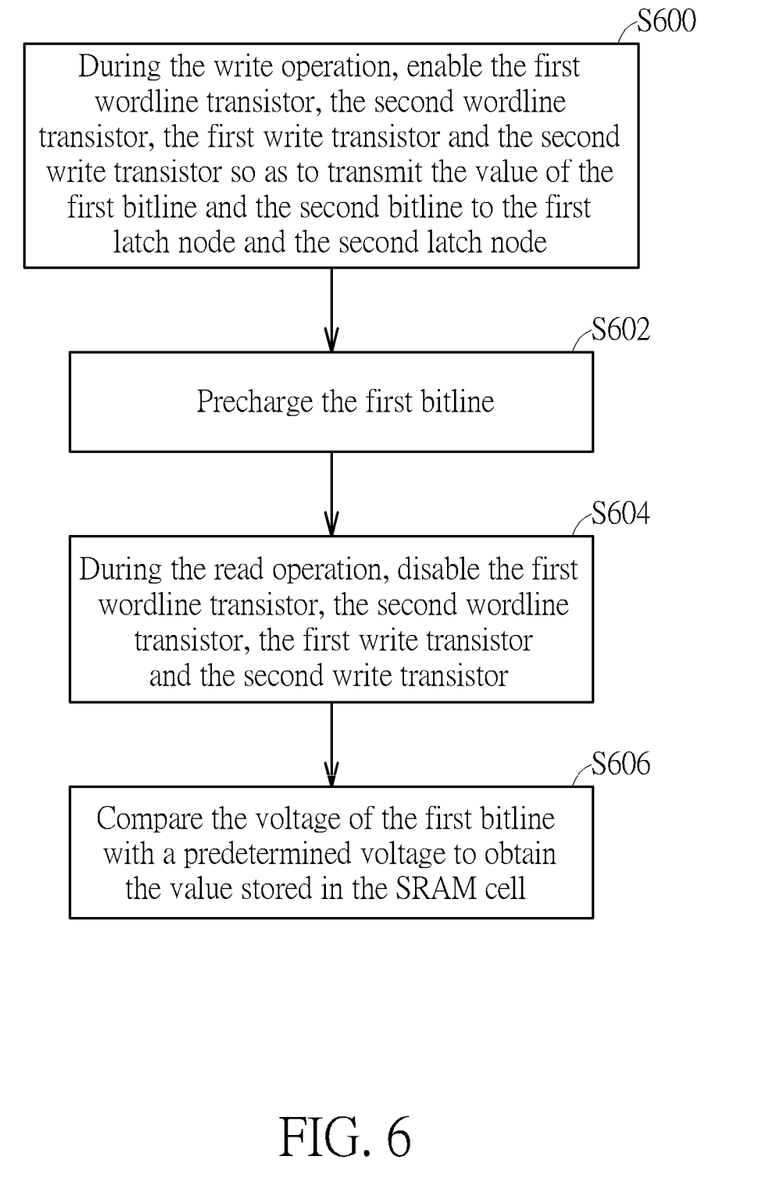
FIG. 6 is a flowchart of a method for operating the static random access memory cells of FIGS. 1 and 4.

FIG. 6 is a flowchart of a method for operating the SRAM cells 100 and 300. It can include the following steps:

S600: During the write operation, enable the first wordline transistor 110, the second wordline transistor 112, the first write transistor 106 and the second write transistor 108 so as to transmit the value of the first bitline BL and the second bitline BLB to the first latch node Q and the second latch node QB. The reference terminal VGND is set to floating.

S602: Precharge the first bitline BL.

S604: During the read operation, disable the first wordline transistor 110, the second wordline transistor 112, the first write transistor 106 and the second write transistor 108. The reference terminal VGND is set to voltage ground.

S606: Compare the voltage of the first bitline BL with a predetermined voltage to obtain the value stored in the SRAM cell 100 or 300.

Figure 7:
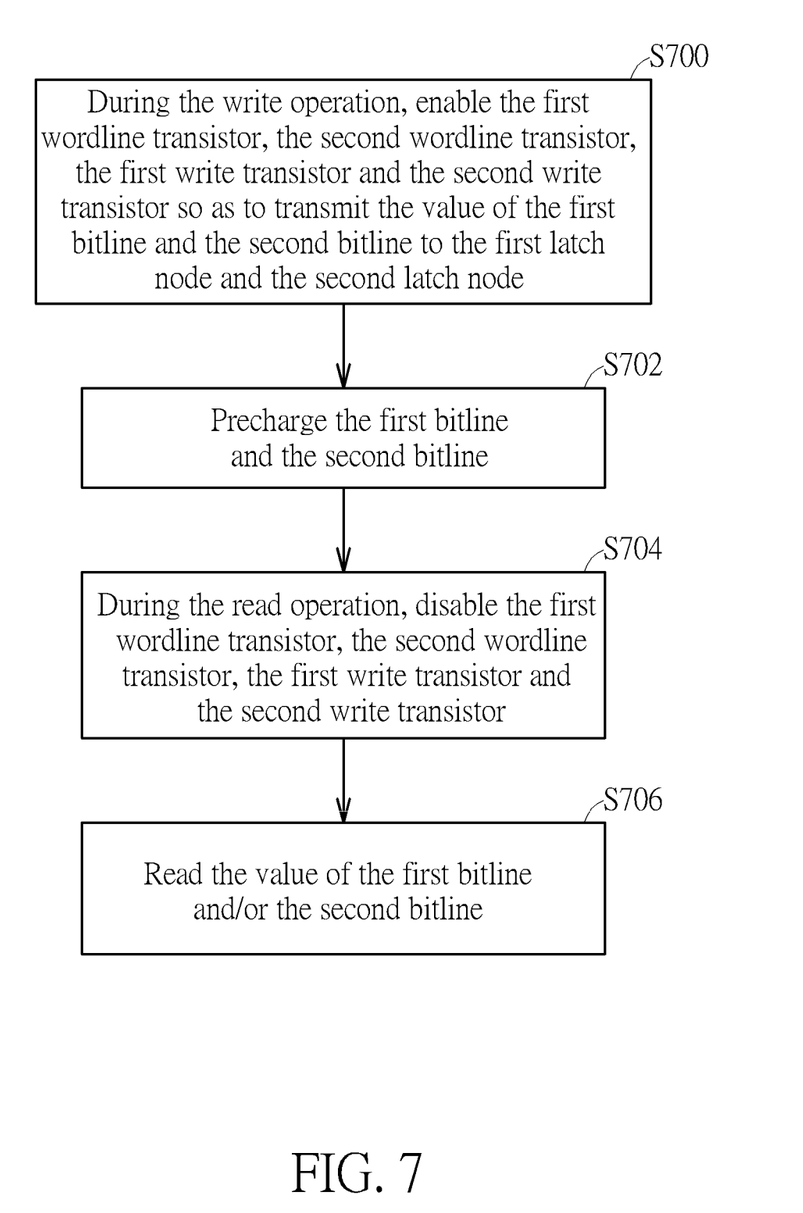
FIG. 7 is a flowchart of a method for operating the static random access memory cells of FIGS. 3 and 5.

FIG. 7 is a flowchart of a method for operating the SRAM cells 200 and 400. It can include the following steps:

S700: During the write operation, enable the first wordline transistor 110, the second wordline transistor 112, the first write transistor 106 and the second write transistor 108 so as to transmit the value of the first bitline BL and the second bitline BLB to the first latch node Q and the second latch node QB. The reference terminal VGND is set to floating.

S702: Precharge the first bitline BL and the second bitline BLB.

S704: During the read operation, disable the first wordline transistor 110, the second wordline transistor 112, the first write transistor 106 and the second write transistor 108. The reference terminal VGND is set to voltage ground.

S706: Read the value of the first bitline BL and/or the second bitline BLB.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A static random access memory (SRAM) cell comprising:
    first and second cross-coupled inverters, the first inverter having a first latch node and the second inverter having a second latch node;
    a first write transistor coupled in series with a first wordline transistor between the first latch node of the first inverter and a first bitline; and
    a first read transistor having a first terminal directly coupled to the first bitline, a second terminal coupled to a reference terminal, and a control terminal coupled to the first latch node of the first inverter.

2. The SRAM cell of claim 1 wherein the first inverter comprises a first pull-up transistor and a first pull-down transistor, and the second inverter comprises a second pull-up transistor and a second pull-down transistor.

3. The SRAM cell of claim 2 wherein the first pull-up transistor and the second pull-up transistor are p-type transistors, and the first pull-down transistor and the second pull-down transistor are n-type transistors.

4. The SRAM cell of claim 1 wherein the first write transistor, the first wordline transistor and the first read transistor are n-type transistors.

5. The SRAM cell of claim 1 further comprising:
    a second write transistor and a second wordline transistor coupled in series between the second latch node of the second inverter and a second bitline.

6. The SRAM cell of claim 5 further comprising:
    a second read transistor coupled between the second bitline and the reference terminal, and having a control terminal coupled to the second latch node of the second inverter.

7. The SRAM cell of claim 1 wherein the reference terminal is set to floating during a write operation and the reference terminal is set to ground during a read operation.

8. A static random access memory (SRAM) cell comprising:
    first and second cross-coupled inverters, the first inverter having a first latch node and the second inverter having a second latch node;
    a first write transistor coupled in series with a first wordline transistor between the first latch node of the first inverter and a first bitline; and
    a first read transistor having a first terminal directly coupled to the first bitline, a second terminal coupled to a reference terminal, and a control terminal coupled to the second latch node of the second inverter.

9. The SRAM cell of claim 8 wherein the first inverter comprises a first pull-up transistor and a first pull-down transistor, and the second inverter comprises a second pull-up transistor and a second pull-down transistor.

10. The SRAM cell of claim 9 wherein the first pull-up transistor and the second pull-up transistor are p-type transistors, and the first pull-down transistor and the second pull-down transistor are n-type transistors.

11. The SRAM cell of claim 8 wherein the first write transistor, the first wordline transistor and the first read transistor are n-type transistors.

12. The SRAM cell of claim 8 further comprising:
    a second write transistor and a second wordline transistor coupled in series between the second latch node of the second inverter and a second bitline.

13. The SRAM cell of claim 11 further comprising:
    a second read transistor coupled between the second bitline and the reference terminal, and having a control terminal coupled to the first latch node of the first inverter.

14. The SRAM cell of claim 8 wherein the reference terminal is set to floating during a write operation and the reference terminal is set to ground during a read operation.

15. A method of operating a static random access memory (SRAM) cell, the SRAM cell comprising first and second cross-coupled inverters, the first inverter having a first latch node and the second inverter having a second latch node, a first write transistor coupled in series with a first wordline transistor between the first latch node of the first inverter and a first bitline, and a first read transistor having a first terminal directly coupled to the first bitline, a second terminal coupled to a reference terminal, and a control terminal coupled to the first latch node of the first inverter, the method comprising:
    enabling the first wordline transistor during a write operation; and
    enabling the first write transistor during the write operation;
    wherein the reference terminal is set to floating during the write operation.

16. The method of claim 15 further comprising:
    disabling the first write transistor during a read operation; and
    disabling the first wordline transistor during the read operation;
    wherein the reference terminal is set to ground during the read operation.

17. The method of claim 15 further comprising precharging the first bitline before the read operation.

18. The method of claim 15, the SRAM cell further comprises a second write transistor and a second wordline transistor coupled in series between the second latch node of the second inverter and a second bitline, the method comprising:
    enabling the second wordline transistor during the write operation; and
    enabling the second write transistor during the write operation.

19. The method of claim 18 further comprising:
disabling the second write transistor during the read operation; and
disabling the second wordline transistor during the read operation.

20. The method of claim 19 further comprising precharging the second bitline before the read operation.

21. The method of claim 20 further comprising comparing a voltage of the second bitline with a predetermined voltage after disabling the second write transistor and the second wordline transistor.

22. The method of claim 18, wherein the SRAM cell further comprises a second read transistor coupled between the second bitline and the reference terminal, and has a control terminal coupled to the second latch node of the second inverter.

23. A method of operating a static random access memory (SRAM) cell, the SRAM cell comprising first and second cross-coupled inverters, the first inverter having a first latch node and the second inverter having a second latch node, a first write transistor coupled in series with a first wordline transistor between the first latch node of the first inverter and a first bitline, and a first read transistor having a first terminal directly coupled to the first bitline, a second terminal coupled to a reference terminal, and a control terminal coupled to the second latch node of the second inverter, the method comprising:
enabling the first wordline transistor during a write operation; and
enabling the first write transistor during the write operation;
wherein the reference terminal is set to floating during the write operation.

24. The method of claim 23 further comprising:
disabling the first write transistor during a read operation; and
disabling the first wordline transistor during the read operation;
wherein the reference terminal is set to ground during the read operation.

25. The method of claim 23 further comprising precharging the first bitline before the read operation.

26. The method of claim 23, wherein the SRAM cell further comprises a second write transistor and a second wordline transistor coupled in series between the second latch node of the second inverter and a second bitline, the method comprising:
enabling the second wordline transistor during the write operation; and
enabling the second write transistor during the write operation.

27. The method of claim 26 further comprising:
disabling the second write transistor during the read operation; and
disabling the second wordline transistor during the read operation.

28. The method of claim 27 further comprising precharging the second bitline before the read operation.

29. The method of claim 28 further comprising comparing a voltage of the second bitline with a predetermined voltage after disabling the second write transistor and the second wordline transistor.

30. The method of claim 26, wherein the SRAM cell further comprises a second read transistor coupled between the second bitline and the reference terminal, and having a control terminal coupled to the first latch node of the first inverter.

* * * * *